United States Patent

Sakai

[11] Patent Number: 6,065,201
[45] Date of Patent: May 23, 2000

[54] METHOD OF TRANSFERRING CONDUCTIVE BALLS ONTO WORK PIECE

[75] Inventor: Tadahiko Sakai, Fukuoka, Japan

[73] Assignee: Matsushita Electric Industrial Co., Ltd., Osaka, Japan

[21] Appl. No.: 09/064,748

[22] Filed: Apr. 23, 1998

[30] Foreign Application Priority Data

Apr. 25, 1997 [JP] Japan .................................. 9-108783

[51] Int. Cl.[7] .................................................. B21D 39/03
[52] U.S. Cl. .................................. 29/430; 29/743; 228/41; 228/245; 414/156
[58] Field of Search ............................. 29/430, 559, 843, 29/743; 228/41, 180.22, 245, 256; 414/156, 620, 627

[56] References Cited

U.S. PATENT DOCUMENTS 5,657,528  8/1997  Sakemi et al. ............................ 29/430

FOREIGN PATENT DOCUMENTS 8-112671  5/1996  Japan .

*Primary Examiner*—S. Thomas Hughes
*Assistant Examiner*—K Vereene
*Attorney, Agent, or Firm*—Stevens, Davis, Miller & Mosher, L.L.P.

[57] ABSTRACT

A method of transferring conductive balls via a suction head without picking up errors and mounting errors includes moving a suction head with pores towards the conductive balls located in a case and applying a vacuum pressure to the pores to suck and pick up the conductive balls. While the suction head is moved away from the case, the suction head is vibrated by oscillators at different frequencies changed within a predetermined frequency range, thereby dropping redundant conductive balls from the suction head. Further, the suction head is moved to a position above a work piece and moved towards the work piece. The pores are communicated with atmosphere to mount the conductive balls onto the work piece. While the suction head is away from the work piece, the suction head is vibrated by oscillators at different frequencies changed within a predetermined frequency range.

19 Claims, 5 Drawing Sheets

METHOD OF TRANSFERRING CONDUCTIVE BALLS ONTO WORK PIECE

BACKGROUND OF THE INVENTION

1. Field of the Invention

The present invention relates to a method of transferring conductive balls onto a work piece.

2. Background Art

In manufacture of an electronic part with bumps such as a flip chip and a BGA (Ball Grid Array), conductive balls such as solder balls are used. A suction head has been used to transfer the conductive balls onto a work piece such as a chip and a substrate.

The suction head is provided at a contact surface thereof with a number of pores communicated with a vacuum source. The suction head vacuum-sucks at the contact surface the conductive balls in a container or the like and picks them up. The suction head is moved to a position above the work piece and lowered to mount the conductive balls onto electrodes of the work piece. Since a number of conductive balls can be simultaneously mounted onto the work piece, an operation efficiency is advantageously excellent.

However, in the mounting of the conductive balls onto the work piece using the suction head, there is a problem that picking up errors or mounting errors often occur.

In order to overcome such errors, counter measures have been proposed in, for example, JP-A-8-12671. In JP-A-8-12671, as shown in FIGS. 2–4, the suction head is provided with a vibration applicator. The suction head is vibrated by the applicator when the conductive balls are picked up by the suction head and mounted onto the electrodes of the work piece. According to this process, redundant conductive balls are forcedly removed from the surface of the suction head.

However, in the prior art described above, a vibration frequency of the vibration applicator is fixed. Therefore, when the vibration is applied to the suction head, if the frequency of the vibration applicator coincides with a natural frequency of the suction head which is determined by the structural properties and the mass of the suction head, resonance occurs and then the suction head can vibrate at a larger amplitude. If not, there is no resonance, and then the suction head vibrates at a normal amplitude. In such a case, it is difficult to remove the redundant conductive balls fully from the surface of the suction head. The picking-up errors and the mounting errors cannot be completely eliminated.

SUMMARY OF THE INVENTION

An object of the invention is to provide a method of transferring the conductive balls by which they can be securely mounted onto electrodes of a work piece without picking up errors and mounting errors.

To this end, the present invention provides a method of transferring conductive balls comprising the steps of: moving a suction head with pores towards the conductive balls in a case and applying vacuum pressure to the pores; sucking and picking up the conductive balls by means of the pores; moving the suction head away from the case while the suction head is vibrated at different frequencies changed within a predetermined frequency range; moving the suction head to a position above a work piece; moving the suction head towards the work piece; making the pores communicate with atmosphere and then mounting the conductive balls onto the work piece; and moving the suction head away from the work piece.

DETAILED DESCRIPTION OF THE PREFERRED EMBODIMENT

A ball transfer device according to one embodiment of the present invention is described hereinafter with reference to the accompanying drawings.

Figure 1:
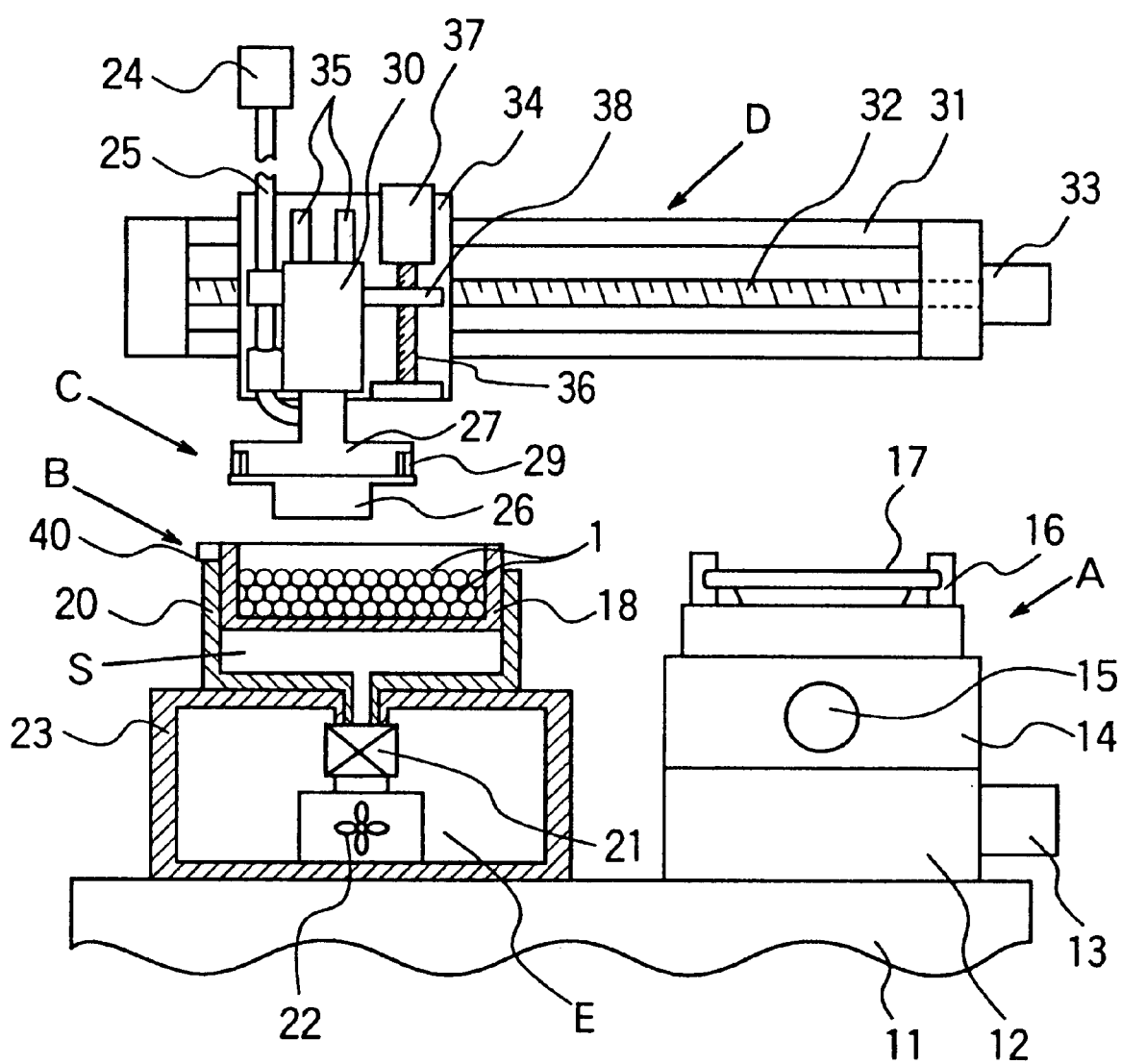
FIG. 1 is a front view of a conductive ball transfer device according to an embodiment of the invention.

In FIG. 1, a positioning table A is mounted on a base 11. The positioning table A includes a Y-table 12 driven by a Y-axis motor 13 and an X-table 14 driven by an X-axis motor 15, which is mounted on the Y-table 12. A holder 16 is mounted on the X-table 14 for holding a work piece 17. Therefore, by operating the X-axis and Y-axis motors 15 and 13, the work piece 17 is placed in a predetermined position.

On the base 11, a conductive ball supply section B is disposed beside the positioning table A. The supply section B includes a ball case 18 and an outer case 20 surrounding the ball case 18. The ball case 18 is a container having an open top, which contains therein a large quantity of conductive balls 1. As clearly shown in FIG. 2, the ball case 18 is provided at a bottom thereof with vent holes 18a each of which has a diameter smaller than that of the conductive ball 1. The vent holes 18a are communicated with a space S defined between the case 18 and the outer case 20. The case 20 is mounted on a base 23 in which a gas supply means E is disposed. The gas supply means E includes a blower 22 which can supply inert gas or dry air into the space S through a passage in which a valve 21 is provided for opening/closing such passage.

Figure 2:
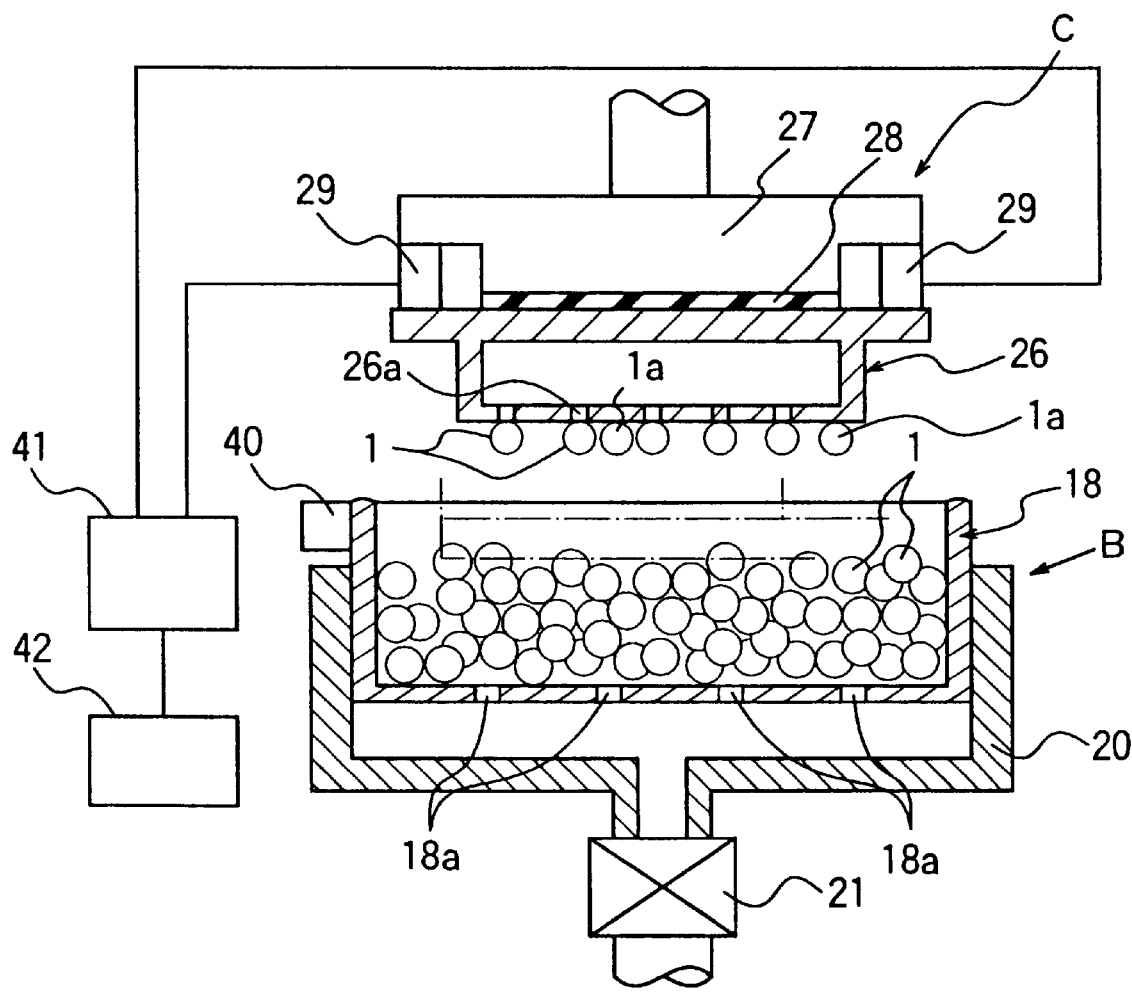
FIGS. 2–4 are views showing the suction head and a ball case shown in FIG. 1, respectively.

When the blower 22 is operated and the valve 21 is opened, the inert gas is discharged upward through the conductive balls 1 via the space S and the vent holes 18a. According to this process, the conductive balls 1 move around in the ball case 18 to prevent them from being cohered together. Specifically, the conductive balls 1 can be individually separated from one another and then readily caught by the pores 26a of the suction tool 26 (described later) one by one. Alternately, the ball case 18 may be shaken by a shaker 40 so as to separate the conductive balls 1 individually (FIG. 2).

A suction head C for picking up the conductive balls 1 includes a lifting block 27 and a suction tool 26 attached to the block 27 via a rubber cushion 28. The suction tool 26 is generally of a hollow rectangular parallelepiped shape and communicated with a suction device 24 via a piping 25. On a contact wall of the tool 26 formed are a number of pores 26a in a matrix form. The arrangement of the pores 26a and the number of the pores 26a correspond to the arrangement of the electrodes and the number of the electrodes of the work piece 17 to be treated, respectively. Though the number of pores of the real suction tool (or of electrodes of the real work piece) is extremely large, for example, about 1500 pores being arranged in 30 (3×10) groups, each including pores of 7 lines and 7 columns (7×7×3×10=1470), the number of pores 26a are substantially reduced in the drawings so as to make the explanation simple.

A pair of oscillators 29 as a vibration applicator are provided at opposite sides of the suction tool 26. When the oscillators 29 are operated, the redundant conductive balls adhered onto portions of the contact wall of the suction tool 26 other than the pores 26a, which balls are designated by a reference numeral 1a in FIG. 2, can be shaken down or dropped off. The rubber cushion 28 prevents the vibration from transmitting from the oscillators 29 to the lifting block 27, thereby preventing it from rattling. The oscillators 29 are operated by a driver 41 at different frequencies. The driver 41 is controlled by a controller 42.

In FIG. 1, a transferring device D reciprocates the suction head C between the supply section B and the work piece 17. The suction head C is held by a block 30 of the device D. The block 30 is vertically movable along guide rails 35 which are provided on one side of a bracket 34. The block 30 is integrally provided with a thread portion 38 which engages with a vertical feed screw 36 attached to an output shaft of a Z-axis motor 37. Therefore, when the motor 37 is driven forwardly or reversely to rotate the feed screw 36 forwardly or reversely, the suction head C is moved vertically along the guide rails 35.

The bracket 34 is integrally provided at a rear side thereof with a thread portion (not shown) which engages with a feed screw 32 attached to an output shaft of an X-axis motor 33. A table 31 holds the feed screw 32 horizontally. Therefore, when the motor 33 is driven forwardly or reversely to rotate the feed screw 32 forwardly or reversely, the suction head C is horizontally moved.

Operation of the ball transfer device for the conductive balls 1 is described hereinafter with reference to FIG. 1. At first, the X-axis motor 33 is driven to move the suction head C to a position above the supply section B. The suction tool 26 is evacuated by the suction device 24. Then, the Z-axis motor 37 is driven to move the suction head C down into the ball case 18. As shown by a chain line in FIG. 2, the suction head C is moved into the case 18 until the contact wall of the suction tool 26 is slightly sunk into the conductive balls 1 in the ball case 18. Subsequently, the Z-axis motor 37 is driven reversely to move the suction head C upwardly. Then, the conductive balls 1 are vacuum sucked and picked up by the pores 26a of the suction tool 26.

Figure 3:
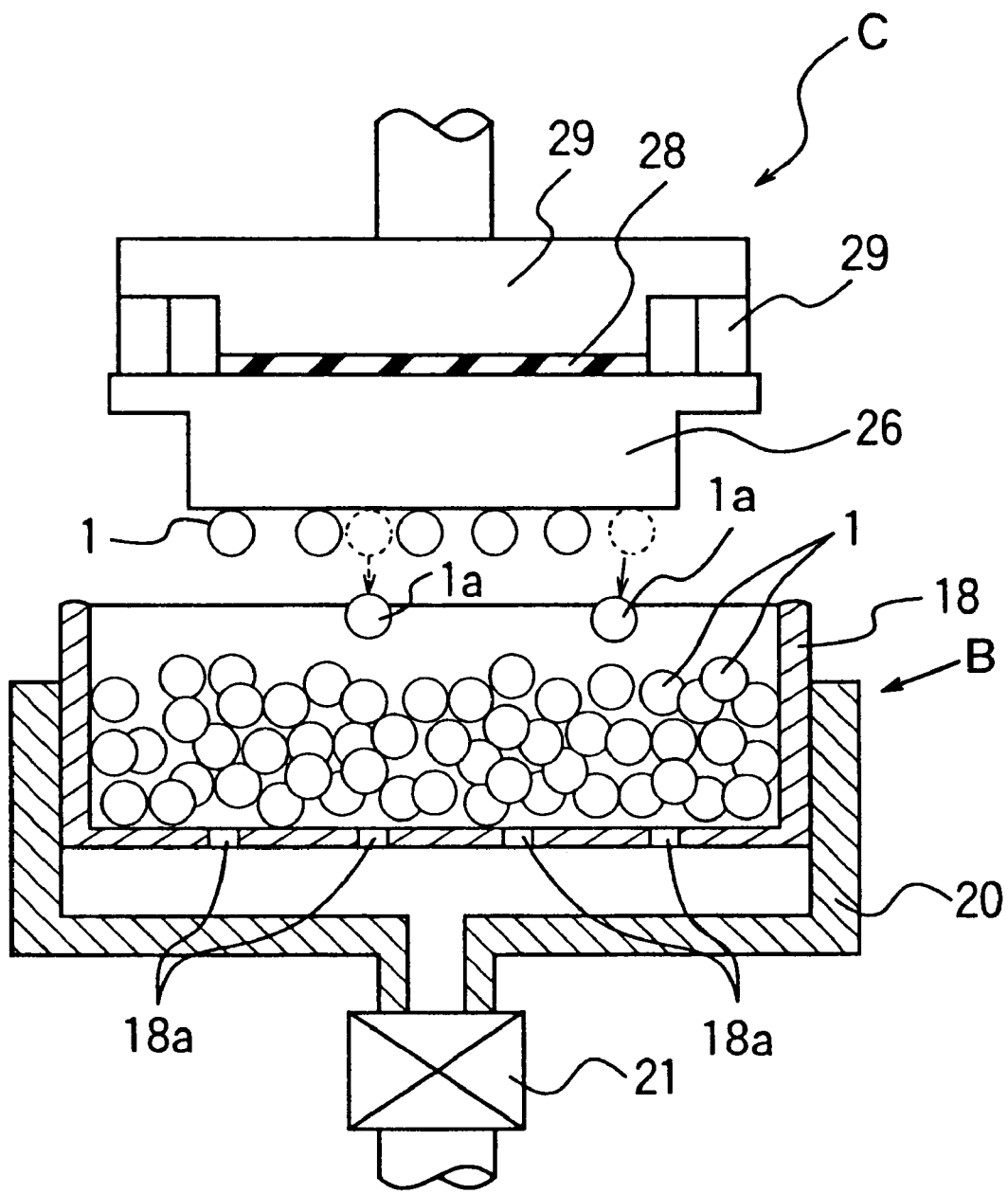

As shown in FIG. 2, the conductive balls 1a may be excessively attracted to the contact wall of the suction tool 26. In such a case, as shown in FIG. 3, the oscillators 29 are operated to vibrate the suction tool 26. The oscillator 29 is, for example, a piezoelectric element which stretches and contracts in an axial direction thereof (or vertically in this case) on receipt of any signals. Therefore, due to the complicated configuration of the suction tool 26, it vibrates in various directions. As a result, the conductive balls 1 strongly sucked directly by the pores 26a remain in the contact wall, but the redundant balls 1a drop back into the supply section B due to a weak suction or adhering force.

Also in FIG. 2, while the suction tool 26 is moved downward into the position shown by the chain line, when the valve 21 is opened to introduce the gas into the ball case 18 so as to move around the balls 1 in the case 18, they are separated from one another in the case 18. Therefore, the conductive balls 1 can be easily sucked by the pores 26a individually.

Figure 4:
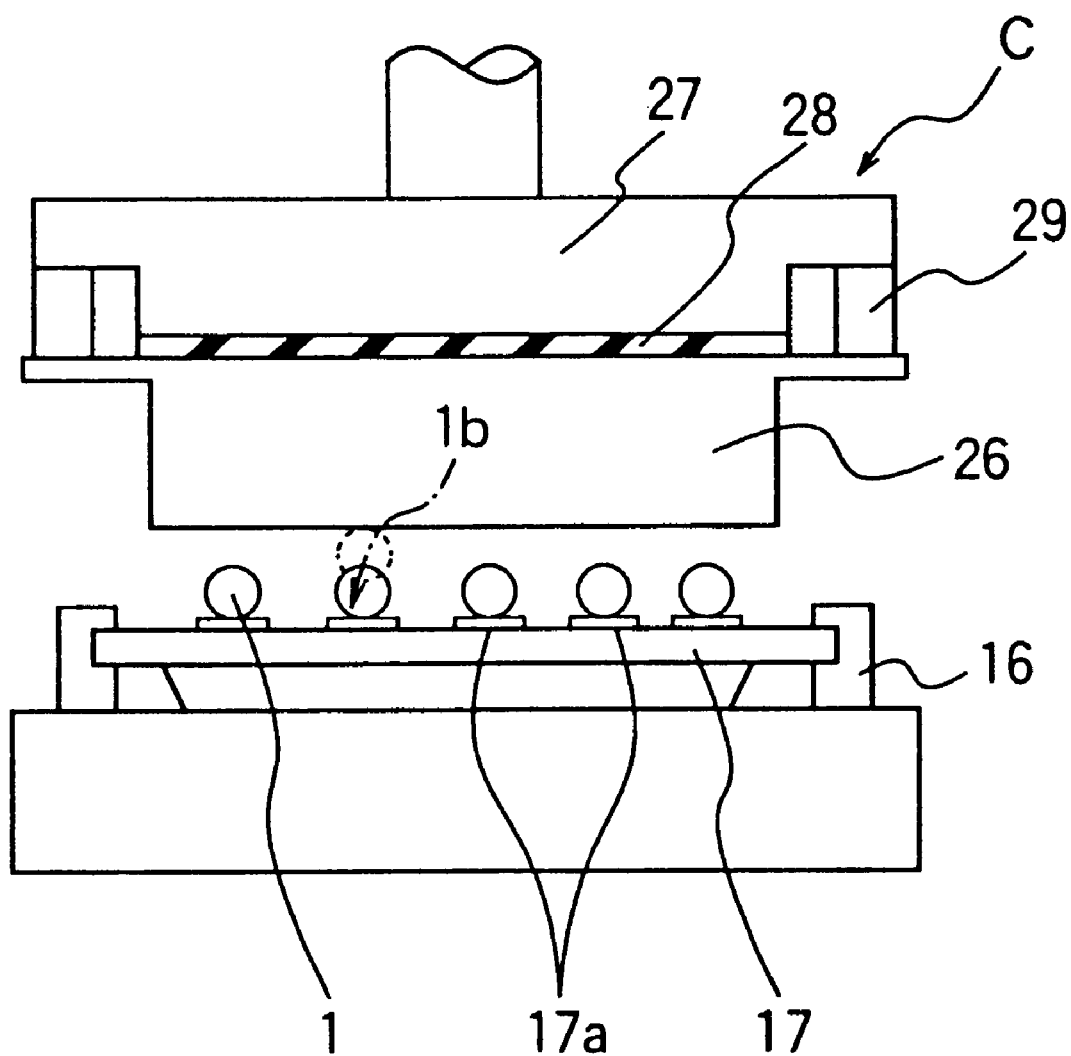

The X-axis motor 33 is driven to move the suction head C picking up the conductive balls 1 to the position above the work piece 17 (FIG. 4). Further the Z-axis motor 37 is driven to move the suction head C downwards so as to place the conductive balls 1 onto electrodes 17a of the work piece 17, respectively. Subsequently, the suction tool 26 is changed to be communicated with an atmosphere and then moved upwards by the Z-axis motor 37. As a result, the conductive balls 1 are mounted on the corresponding electrodes 17a. However, in some case, as shown by a broken line in FIG. 4, the mounting errors may occur. Specifically, the conductive ball 1b may remain on the contact wall of the suction tool 26 without being mounted onto the electrode 17a. Therefore, in this embodiment, when the suction head C is moved upwards by the Z-axis motor 37, the oscillators 29 are operated again to vibrate the suction tool 26. Then, the conductive ball 1b is removed from the contact wall of the suction tool 26 and mounted securely onto the electrode 17a. Incidentally, when the oscillators 29 are operated, the suction tool 26 is vibrated. However, since the rubber cushion 28 is interposed between the lifting block 27 and the suction tool 26, the vibration is prevented from being transmitted from the oscillators 29 to the lifting block 27. Therefore, a decrease of positioning precision of the transferring device D and other problem do not occur.

Operations and the meritorious advantages of the oscillators 29 attached to the suction tool 26 are described hereinafter. By operating the oscillators 29, the vibration is transmitted to the suction tool 26. When the suction tool 26 is considered as a vibration system, the oscillators 29 serve as means for generating a vibratory force for vibrating the suction tool 26 forcedly. This vibration system has a natural frequency which is determined by the structural characteristics and the loading conditions. The structural characteristics are determined by the configuration, the dimension, the material and the like of the suction tool 26 and the loading conditions are determined by the pressure applied to the suction tool 26 due to the atmospheric pressure during the vacuum suction. When the natural frequency is coincident with the frequency of the vibratory force, resonance occurs in which an amplitude of the suction tool 26 becomes large.

In order to drop the conductive balls 1a and 1b from the suction tool 26 by vibrating it, it is preferable to use this resonance phenomenon. However, it is generally difficult to calculate an accurate natural frequency of the suction tool 26 through calculation and predetermine the resonance conditions under which the resonance of the suction tool 26 can be occurred. Further, when the suction tool 26 vibrates, all portions of the contact wall of the suction tool 26 do not vibrate with amplitudes sufficient to drop the redundant conductive balls 1. Therefore, when the oscillators 29 vibrate the suction tool 26 at a fixed frequency, some portions of the contact wall of the suction tool 26 vibrate with sufficient amplitudes, but other ones vibrate with insufficient amplitudes.

Figure 5A:
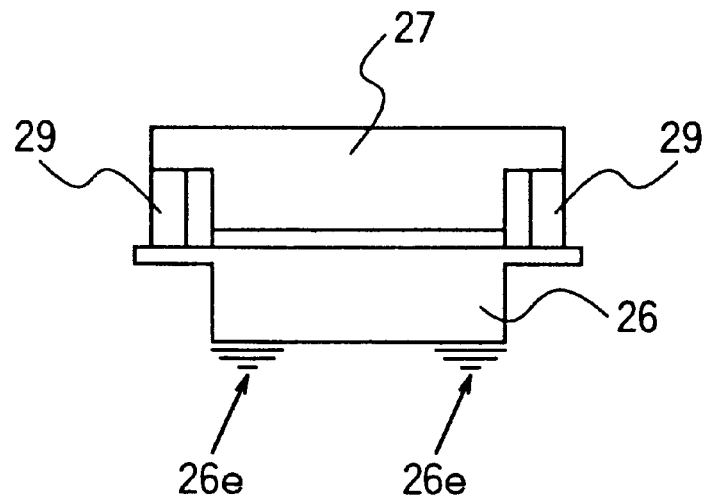
FIGS. 5A and 5B are views showing the suction head shown in FIG. 1.
Figure 5B:
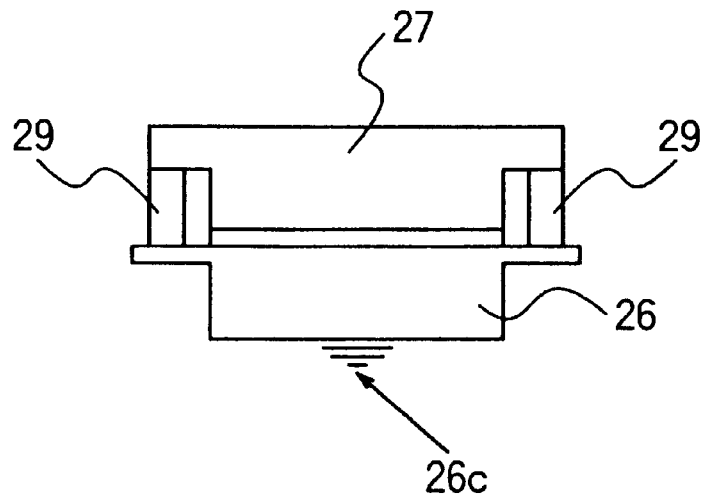

Then, according to the present invention, in order to overcome the above-mentioned problems, the frequency at which the oscillators 29 vibrate the suction tool 26 is changed within a predetermined range. Such frequency is referred hereinafter as the "exciting frequency". When the suction tool 26 is vibrated at one frequency, as shown in FIG. 5A, edge portions 26e of the suction tool 26 are largely vibrated. When the suction tool 26 is vibrated at another frequency, as shown in FIG. 5B, a central portion 26c of the suction tool 26 is largely vibrated. In other words, the portions of the suction tool 26 which vibrate with larger amplitudes are moved around throughout the suction tool 26 by changing the exciting frequency.

According to this embodiment, while the suction tool 26 is moved upwards from the ball case 18 (FIG. 3) and/or it is moved downwards towards the work piece 17, the exciting frequency is changed from 10 KHz to 40 KHz by 5 KHz within 0.5 seconds. This process is repeated two or three times. The range of the exciting frequency of the oscillators 29 and the timing of driving the driver 41 for vibrating the oscillators 29 are controlled by the controller 42. Alternately, instead of a discrete frequency change described above, the frequency of the oscillator 29 may be changed continuously from 10 KHz to 40 KHz.

Accordingly, each portion of the contact wall of the suction tool 26 can be vibrated at a large amplitude during the process of changing the exciting frequency. As a result, the redundant conductive balls 1a and/or the remaining conductive balls 1b are removed from the contact wall of the suction tool 26 by means of the resonance phenomenon.

Incidentally, if the oscillators 29 are operated to vibrate the suction head C when it is moved into the case 18 for picking up the conductive balls 1, they further move around in the ball base, thereby picking them up more readily.

According to the present invention, the resonance infallibly occurs in any portion of the suction tool 26 during the process of changing the exciting frequency of the oscillator 29. Therefore the redundant conductive balls 1a and/or the remaining conductive balls 1b are removed from the contact wall of the suction tool 26 by means of the resonance phenomenon, thereby preventing picking-up errors and the mounting errors.

What is claimed is:

1. A method of transferring conductive balls comprising the steps of:
   (a) moving a suction head with pores towards the conductive balls disposed in a case and applying vacuum pressure to said pores;
   (b) sucking and picking up the conductive balls by means of said pores;
   (c) moving said suction head away from said case while vibrating said suction head at different frequencies which are changed within a predetermined frequency range;
   (d) moving said suction head to a position above a work piece;
   (e) moving said suction head towards said work piece;
   (f) making said pores communicate with atmosphere and then mounting said conductive balls onto said work piece; and
   (f) moving said suction head away from said work piece.

2. A method according to claim 1, wherein during step (g), said suction head is vibrated at different frequencies which are changed within a predetermined frequency range.

3. A method according to claim 1, wherein in step (c), the frequency of the vibration of said suction head is changed continuously.

4. A method according to claim 1, wherein in step (c), the frequency of the vibration of said suction head is changed between 10 KHz and 40 KHz.

5. A method according to claim 2, wherein in step (c), the frequency of the vibration of said suction head is changed continuously.

6. A method according to claim 2, wherein in step (c), the frequency of the vibration of said suction head is changed between 10 KHz and 40 KHz.

7. A method according to claim 1, wherein in step (c), the frequency of the vibration of said suction head is changed discretely.

8. A method according to claim 2, wherein in step (c), the frequency of the vibration of said suction head is changed discretely.

9. A method according to claim 2, wherein in step (g), the frequency of the vibration of said suction head is changed discretely.

10. A method according to claim 2, wherein in step (g), the frequency of the vibration of said suction head is changed continuously.

11. A method according to claim 2, wherein in step (g), the frequency of the vibration of said suction head is changed between 10 KHz and 40 KHz.

12. A method of transferring conductive balls comprising the steps of:
    (a) moving a suction head with pores towards the conductive balls disposed in a case and applying vacuum pressure to said pores;
    (b) sucking and picking up the conductive balls by means of said pores;
    (c) moving said suction head away from said case;
    (d) moving said suction head to a position above a work piece;
    (e) moving said suction head towards said work piece;
    (f) making said pores communicate with atmosphere and then mounting said conductive balls onto said work piece; and
    (g) moving said suction head away from said work piece while vibrating said suction head at different frequencies which are changed within a predetermined frequency range.

13. A method according to claim 12, wherein in step (g), the frequency of the vibration of said suction head is changed continuously.

14. A method according to claim 12, wherein in step (g), the frequency of the vibration of said suction head is changed between 10 KHz and 40 KHz.

15. A method according to claim 12, wherein in step (g), the frequency of the vibration of said suction head is changed discretely.

16. A method of transferring conductive balls, which are sucked to a plurality of pores formed in a bottom surface of a suction head, to a workpiece, including the step of:
    applying vibration with variable frequency to said suction head, after the conductive balls are sucked to the pores, in order to remove conductive balls sticking to the bottom surface of the suction head, other than those sucked to the pores.

17. A method according to claim 16, wherein the variable frequency is changed continuously.

18. A method according to claim 16, wherein the variable frequency is changed discretely.

19. A method according to claim 16, wherein the variable frequency is changed between 10 to 40 KHz.

* * * * *